(12) United States Patent
Ogino et al.

(10) Patent No.: US 11,732,214 B2
(45) Date of Patent: Aug. 22, 2023

(54) CLEANING AGENT COMPOSITION COMPRISING AN ALKYLAMIDE SOLVENT AND A FLUORINE-CONTAINING QUATERNARY AMMONIUM SALT

(71) Applicant: NISSAN CHEMICAL CORPORATION, Tokyo (JP)

(72) Inventors: Hiroshi Ogino, Toyama (JP); Tetsuya Shinjo, Toyama (JP); Shunsuke Moriya, Toyama (JP); Takahisa Okuno, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/777,772

(22) PCT Filed: Nov. 16, 2020

(86) PCT No.: PCT/JP2020/042594
§ 371 (c)(1),
(2) Date: May 18, 2022

(87) PCT Pub. No.: WO2021/100651
PCT Pub. Date: May 27, 2021

(65) Prior Publication Data
US 2023/0002701 A1    Jan. 5, 2023

(30) Foreign Application Priority Data
Nov. 20, 2019    (JP) .................. 2019-209959

(51) Int. Cl.
| C11D 3/43 | (2006.01) |
| C11D 1/62 | (2006.01) |
| C11D 1/52 | (2006.01) |
| C11D 3/24 | (2006.01) |

(52) U.S. Cl.
CPC .................. *C11D 1/62* (2013.01); *C11D 1/52* (2013.01); *C11D 3/245* (2013.01)

(58) Field of Classification Search
CPC ....... C11D 7/3263; C11D 7/50; C11D 7/5004; C11D 7/5077; C11D 7/5095; C11D 7/110023; C11D 11/0029; C11D 11/0047
See application file for complete search history.

(56) References Cited

U.S. PATENT DOCUMENTS

| 4,770,713 A * | 9/1988 | Ward .................. C09D 9/00 510/501 |
| 6,818,608 B2 | 11/2004 | Moore | |
| 2005/0064004 A1 * | 3/2005 | Schnabel ............. C11D 3/43 424/405 |
| 2008/0234162 A1 * | 9/2008 | Rovito .................. C11D 7/10 510/175 |
| 2011/0245127 A1 * | 10/2011 | Suzuki .................. C11D 1/12 510/480 |
| 2012/0181248 A1 * | 7/2012 | Park .................. G03F 7/425 216/13 |
| 2017/0158888 A1 | 6/2017 | Kang et al. |
| 2017/0321168 A1 * | 11/2017 | Hirano .................. B01D 39/00 |
| 2019/0256805 A1 | 8/2019 | Goto et al. |

FOREIGN PATENT DOCUMENTS

| JP | 2004-239986 A | | 8/2004 |
| KR | 10-2014-0024625 A | | 3/2014 |
| KR | 10-2014-0064401 A | | 5/2014 |
| KR | 10-2016-0017606 A | | 2/2016 |
| KR | 20160017606 | * | 2/2016 |
| WO | WO 2014/092022 A1 | | 6/2014 |
| WO | WO 2018/088202 A1 | | 5/2018 |

OTHER PUBLICATIONS

ISR for PCT/JP2020/042594, dated Feb. 16, 2021.
Written Opinion for PCT/JP2020/042594, dated Feb. 16, 2021 (w/ translation).
Office Action for CN App. No. 202080079477.7, dated Oct. 11, 2022 (w/ translation).

* cited by examiner

*Primary Examiner* — Charles I Boyer
(74) *Attorney, Agent, or Firm* — Greenblum & Bernstein, P.L.C.

(57) ABSTRACT

A cleaning agent composition for use in removing an adhesive residue, characterized in that the composition contains a quaternary ammonium salt and a composition solvent including a first organic solvent and a second organic solvent; the first organic solvent is an amide derivative represented by formula (Z) (wherein $R^0$ represents an ethyl group, a propyl group, or an isopropyl group; and each of $R^A$ and $R^B$ represents a C1 to C4 alkyl group); the second organic solvent is a non-amide organic solvent other than the amide derivative; and the composition has a water content less than 4.0 mass %.

(Z)

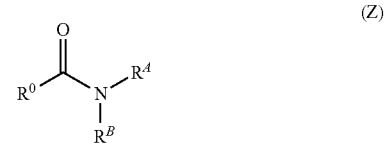

14 Claims, No Drawings

CLEANING AGENT COMPOSITION COMPRISING AN ALKYLAMIDE SOLVENT AND A FLUORINE-CONTAINING QUATERNARY AMMONIUM SALT

TECHNICAL FIELD

The present invention relates to a cleaning agent composition and to a cleaning method.

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked with wire connection by the mediation of through silicon vias (TSVs). In integration of multiple layers, each component wafer to be stacked is thinned by polishing (i.e., grinding) a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine (i.e., grinder). Since the fixation must be easily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing. For example, one required performance includes having high stress (i.e., strong adhesion) within the plane during polishing and low stress (i.e., weak adhesion) toward the thickness direction during detaching. Furthermore, in processing steps, the temperature of a workpiece may exceed 150° C. in some cases. Thus, temporary bonding must be stable at such high temperatures.

Under such circumstances, polysiloxane adhesives meeting the aforementioned characteristic requirements are mainly used as temporary adhesives in the semiconductor industry. In temporary bonding by use of a polysiloxane adhesive, an adhesive residue often remains on a substrate surface after removal of the thinned substrate. In order to avoid an undesired phenomenon in a subsequent step, there has been developed a cleaning agent composition for removing such a residue and cleaning the surface of a semiconductor substrate (see, for example, Patent Documents 1 and 2). Currently, there is continuous demand for a new cleaning agent composition in the semiconductor field. Patent Document 1 discloses a siloxane resin-remover containing a polar, aprotic solvent and a quaternary ammonium hydroxide, and Patent Document 2 discloses a cured resin-remover containing an alkylammonium fluoride. However, development of a more effective cleaning agent composition is expected.

PRIOR ART DOCUMENTS

Patent Documents

Patent Document 1: WO 2014/092022
Patent Document 2: U.S. Pat. No. 6,818,608
Patent Document 3: Korean Patent Application Laid-Open 2014-0064401
Patent Document 4: Korean Patent Application Laid-Open 2014-0024625
Patent Document 5: Korean Patent Application Laid-Open 2016-0017606

SUMMARY OF THE INVENTION

Problems to be Solved by the Invention

The present invention has been conceived in view of the foregoing. Thus, an object of the invention is to provide a cleaning agent composition which exhibits excellent cleaning performance to an adhesive residue remaining after debonding a laminate that has been temporarily bonded by the mediation of an adhesive layer formed from, for example, a polysiloxane adhesive. Another object is to provide a cleaning method using such a cleaning agent composition.

Means for Solving the Problems

The present inventors have conducted extensive studies to attain the aforementioned objects, and have found the following. In cleaning of a substrate (e.g., a semiconductor substrate) on which an adhesive residue remains after debonding a laminate that has been temporarily bonded by the mediation of an adhesive layer formed from a polysiloxane adhesive, when a cleaning agent composition containing a quaternary ammonium salt and a solvent is employed, a specific amide derivative and a non-amide organic solvent other than the amide derivative are used in combination as the solvent. Also, the water content of the cleaning agent composition is regulated to a level lower than a specific value. As a result, a cleaning agent composition that has excellent cleaning performance and that can shorten cleaning time can be provided. The present invention has been accomplished on the basis of this finding.

Notably, Patent Documents 3 to 5 disclose a photoresist remover composition and a cleaning agent composition each employing N,N-dimethylpropionamide. However, none of Patent Documents 3 to 5 specifically discloses the technical feature and advantageous effects of the present invention.

Accordingly, the present invention provides the following.

1. A cleaning agent composition for use in removing an adhesive residue, characterized in that
the composition comprises a quaternary ammonium salt and a composition solvent including a first organic solvent and a second organic solvent;
the first organic solvent is an amide derivative represented by formula (Z):

[F1]

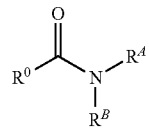

(Z)

(wherein $R^0$ represents an ethyl group, a propyl group, or an isopropyl group; and each of $R^A$ and $R^B$ represents a C1 to C4 alkyl group);

the second organic solvent is a non-amide organic solvent other than the amide derivative; and the composition has a water content less than 4.0 mass %.

2. A cleaning agent composition according to 1 above, wherein the amide derivative includes at least one species selected from the group consisting of N,N-dimethylpropionamide, N,N-diethylpropionamide, N-ethyl-N-methylpropionamide, N,N-dimethylbutyramide, N,N-diethylbutyramide, N-ethyl-N-methylbutyramide, N,N-dimethylisobutyramide, N,N-diethylisobutyramide, and N-ethyl-N-methylisobutyramide.

3. A cleaning agent composition according to 2 above, wherein the amide derivative includes at least one species selected from the group consisting of N,N-dimethylpropionamide, N,N-diethylpropionamide, N,N-dimethylbutyramide, N,N-diethylbutyramide, N,N-dimethylisobutyramide, and N,N-diethylisobutyramide.

4. A cleaning agent composition according to 3 above, wherein the amide derivative includes at least one species selected from the group consisting of N,N-dimethylpropionamide and N,N-dimethylisobutyramide.

5. A cleaning agent composition according to any of 1 to 4 above, wherein the quaternary ammonium salt includes a halogen-containing quaternary ammonium salt.

6. A cleaning agent composition according to 5 above, wherein the halogen-containing quaternary ammonium salt include a fluorine-containing quaternary ammonium salt.

7. A cleaning agent composition according to 6 above, wherein the fluorine-containing quaternary ammonium salt includes a tetra(hydrocarbyl)ammonium fluoride.

8. A cleaning agent composition according to 7 above, wherein the tetra(hydrocarbyl)ammonium fluoride includes at least one species selected from the group consisting of tetramethylammonium fluoride, tetraethylammonium fluoride, tetrapropylammonium fluoride, and tetrabutylammonium fluoride.

9. A cleaning agent composition according to any of 1 to 8 above, wherein the second organic solvent includes at least one species selected from the group consisting of an alkylene glycol dialkyl ether, an aromatic hydrocarbon compound, and a ring-structure-having ether compound.

10. A cleaning agent composition according to any of 1 to 9 above, wherein the composition solvent is formed only of an organic solvent.

11. A cleaning agent composition according to any of 1 to 10 above, wherein the composition solvent has an amide derivative content of 30 to 90 mass %.

12. A cleaning agent composition according to any of 1 to 11 above, which has a water content less than 3.0 mass %.

13. A cleaning agent composition according to 12 above, which has a water content less than 2.0 mass %.

14. A cleaning agent composition according to 13 above, which has a water content less than 1.0 mass %.

15. A cleaning method, characterized by comprising removing an adhesive residue remaining on a substrate by use of a cleaning agent composition as recited in any of 1 to 14 above.

16. A method for producing a processed semiconductor substrate, the method comprising a first step of producing a laminate including a semiconductor substrate, a support substrate, and an adhesive layer formed from an adhesive composition; a second step of processing the semiconductor substrate of the produced laminate; a third step of separating the semiconductor substrate after processing; and a fourth step of removing an adhesive residue remaining on the separated substrate with a cleaning agent composition, characterized in that a cleaning agent composition as recited in any of 1 to 14 above is used as the cleaning agent composition.

Effects of the Invention

According to the cleaning agent composition of the present invention, a substrate (e.g., a semiconductor substrate) on which an adhesive residue remains after debonding a laminate which has been temporarily bonded by the mediation of an adhesive layer formed from a material (e.g., a polysiloxane adhesive) can be cleaned in a short period of time in a simple manner. As a result, high-efficiency production of semiconductor devices is expacted.

MODES FOR CARRYING OUT THE INVENTION

The present invention will next be described in detail.
The cleaning agent composition of the present invention contains a quaternary ammonium salt.

A quaternary ammonium salt is formed of a quaternary ammonium cation and an anion. No particular limitation is imposed on the quaternary ammonium salt, so long as the salt is used for such a cleaning agent composition.

A typical example of such a quaternary ammonium cation is a tetra(hydrocarbyl)ammonium cation. Examples of the counter anion include, but are not limited to, a hydroxide ion ($OH^-$); a halide ion such as a fluoride ion ($F^-$), a chloride ion ($Cl^-$), a bromide ion ($Br^-$), or an iodide ion ($I^-$); a tetrafluoroborate ion ($BF_4^-$); and a hexafluorophosphate ion ($PF_6^-$).

In the present invention, the quaternary ammonium salt preferably includes a halogen-containing quaternary ammonium salt, more preferably a fluorine-containing quaternary ammonium salt.

In the quaternary ammonium salt, a halogen atom may be included in a cation moiety or an anion moiety. Preferably, the halogen atom is included in an anion moiety.

In one preferred embodiment, the fluorine-containing quaternary ammonium salt includes a tetra(hydrocarbyl) ammonium fluoride.

Specific examples of the hydrocarbyl group of the tetra (hydrocarbyl)ammonium fluoride include a C1 to C20 alkyl group, a C2 to C20 alkenyl group, a C2 to C20 alkynyl group, and a C6 to C20 aryl group.

In one preferred embodiment of the present invention, the tetra(hydrocarbyl)ammonium fluoride includes a tetraalkylammonium fluoride.

Specific examples of the tetraalkylammonium fluoride include, but are not limited to, tetramethylammonium fluoride, tetraethylammonium fluoride, tetrapropylammonium fluoride, and tetrabutylammonium fluoride. Among them, tetrabutylammonium fluoride (i.e., TBAF) is preferred.

The quaternary ammonium salt such as tetra(hydrocarbyl) ammonium fluoride may be used in the form of a hydrate. Also, the quaternary ammonium salt such as tetra(hydrocarbyl)ammonium fluoride and a hydrate thereof may be used singly or in combination of two or more species.

So long as the quaternary ammonium salt can be dissolved in the solvent contained in the cleaning agent composition, no particular limitation is imposed on the amount of the salt, and the amount is generally 0.1 to 30 mass % with respect to the cleaning agent composition.

The cleaning agent composition of the present invention contains a composition solvent including a first organic solvent and a second organic solvent, wherein the first organic solvent is an amide derivative represented by formula (Z):

[F2]

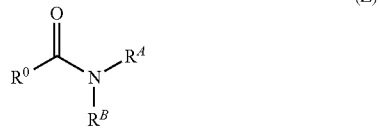
(Z)

and the second organic solvent is a non-amide organic solvent other than the amide derivative.

In formula (Z), $R^O$ represents an ethyl group, a propyl group, or an isopropyl group, with ethyl and isopropyl being preferred, and ethyl being more preferred. Each of $R^A$ and $R^B$ represents a C1 to C4 alkyl group. The C1 to C4 alkyl group may be linear-chain, branched, or cyclic. Specific examples include methyl, ethyl, propyl, isopropyl, cyclopropyl, n-butyl, isobutyl, s-butyl, t-butyl, and cyclobutyl. Among them, both $R^A$ and $R^B$ are preferably methyl or ethyl, and, more preferably, each of $R^A$ and $R^B$ is methyl.

Examples of the amide derivative represented by formula (Z) include, but are not limited to, N,N-dimethylpropionamide, N,N-diethylpropionamide, N-ethyl-N-methylpropionamide, N,N-dimethylbutyramide, N,N-diethylbutyramide, N-ethyl-N-methylbutyramide, N,N-dimethylisobutyramide, N,N-diethylisobutyramide, and N-ethyl-N-methylisobutyramide. These amide derivatives represented by formula (Z) may be used singly or in combination of two or more species.

Of these, N,N-dimethylpropionamide and N,N-dimethylisobutylamide are particularly preferred, with N,N-dimethylpropionamide being more preferred.

The amide derivative represented by formula (Z) may be synthesized through substitution of a corresponding carboxylate ester with a corresponding amine. Alternatively, a commercial product of the amide derivative may also be used.

The cleaning agent composition of the present invention contains one or more organic solvents other than the aforementioned amide derivative.

No particular limitation is imposed on the organic solvent other than the amide derivative, so long as the organic solvent is used in the technical field, can dissolve the quaternary ammonium salt, and is compatible with the aforementioned amide derivative.

Examples of preferred such organic solvents include an alkylene glycol dialkyl ether.

Specific examples of the alkylene glycol dialkyl ether include, but are not limited to, ethylene glycol, dimethyl ether (1,2-dimethoxyethane), ethylene glycol, diethyl ether (1,2-diethoxyethane), ethylene glycol dipropyl ethane, ethylene glycol dibutyl ether, propylene glycol dimethyl ether, propylene glycol diethyl ether, and propylene glycol dipropyl ether.

These alkylene glycol dialkyl ethers may be used singly or in combination of two or more species.

Examples of preferred such organic solvents include an aromatic hydrocarbon compound, and specific examples thereof include aromatic hydrocarbon compounds represented by formula (1).

[F3]

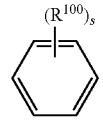
(1)

In the above formula (1), specific examples of the C1 to C6 alkyl group include methyl, ethyl, n-propyl, n-butyl, isobutyl, s-butyl, and t-butyl.

The "s" represents the number of the substituents $R^{100}$s bound to the benzene ring and is 2 or 3.

In one preferred embodiment of the present invention, the aromatic hydrocarbon compound represented by formula (1) is an aromatic hydrocarbon compound represented by formula (1-1) or (1-2):

[F4]

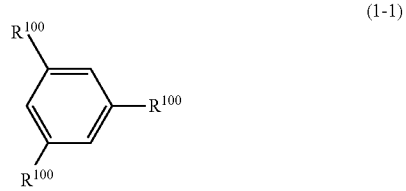
(1-1)

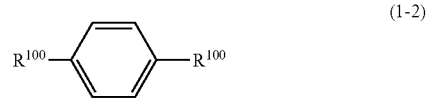
(1-2)

(wherein $R^{100}$s each represent a C1 to C6 alkyl group; the total number of carbon atoms in three C1 to C6 alkyl groups of $R^{100}$ in formula (1-1) is 3 or greater; and the total number of carbon atoms in two C1 to C6 alkyl groups of $R^{100}$ in formula (1-2) is 3 or greater).

Specific examples of the aromatic hydrocarbon compound represented by formula (1) include, but are not limited to, 1,2,3-trimethylbenzene, 1,2,4-trimethylbenzene, 1,2,5-trimethylbenzene, 1,3,5-trimethylbenzene (mesitylene), 4-ethyltoluene, 4-n-propyltoluene, 4-isopropyltoluene, 4-n-butyltoluene, 4-s-butyltoluene, 4-isobutyltoluene, and 4-t-butyltoluene. These aromatic hydrocarbon compounds may be used singly or in combination of two or more species.

Of these, mesitylene and 4-t-butyltoluene are preferred.

Examples of preferred such organic solvents include a ring-structure-having ether compound. Examples of the ring-structure-having ether compound include a cyclic ether compound, a cyclic alkyl-chain alkyl ether compound, a cyclic alkyl-branch ether compound, and a di(cyclic alkyl) ether compound. These ring-structure-having ether compounds may be used singly or in combination or two or more species.

The ring-structure-having ether compound is produced by substituting at least one ring-forming carbon atom of the cyclic hydrocarbon compound by an oxygen atom.

Typical examples of the ring-structure-having ether compound include epoxy compounds formed through epoxidation of a chain, branched, or cyclic saturated hydrocarbon compound (i.e., the case in which the two adjacent carbon atoms and the oxygen atom form a 3-membered ring) and cyclic ether compounds (excepting an epoxy compound, and the definition will apply hereinbelow) in which a carbon atom forming the ring of the cyclic hydrocarbon compound having carbon 4 atoms (excepting an aromatic hydrocarbon compound) is substituted by an oxygen atom. Among them, the cyclic hydrocarbon compound having carbon 4 atoms is preferably a cyclic saturated hydrocarbon compound having carbon 4 atoms.

No particular limitation is imposed on the number of the carbon atoms present in the epoxy compound. The carbon number is generally 4 to 40, preferably 6 to 12.

No particular limitation is imposed on the number of epoxy groups, and the number is generally 1 to 4, preferably 1 or 2.

Specific examples of the epoxy compound include, but are not limited to, epoxy chain or branched saturated hydrocarbon compounds such as 1,2-epoxy-n-butane, 1,2-epoxy-n-pentane, 1,2-epoxy-n-hexane, 1,2-epoxy-n-heptane, 1,2-epoxy-n-octane, 1,2-epoxy-n-nonane, 1,2-epoxy-n-decane, and 1,2-epoxy-n-eicosane; and epoxy cyclic saturated hydrocarbon compounds such as 1,2-epoxy-cyclopentane, 1,2-epoxy-cyclohexane, 1,2-epoxy-cycloheptane, 1,2-epoxy-cyclooctane, 1,2-epoxy-cyclononane, 1,2-epoxy-cyclodecane, and 1,2-epoxy-cycloeicosane.

No particular limitation is imposed on the number of carbon atoms of the cyclic ether compound other than the aforementioned epoxy compounds is generally 3 to 40, preferably 4 to 8.

No particular limitation is imposed on the number of oxygen atoms (ether groups), and the number is generally 1 to 3, preferably 1 or 2.

Specific examples of the cyclic ether compound other than the aforementioned epoxy compounds include, but are not limited to, oxacyclic saturated hydrocarbon compounds such as oxacyclobutane (oxetane), oxacyclopentane (tetrahydrofuran), and oxacyclohexane; and dioxacyclic saturated hydrocarbon compounds such as 1,3-dioxacyclopentane, 1,3-dioxacyclohexane (1,3-dioxane), and 1,4-dioxacyclohexane (1,4-dioxane).

The cycloalkyl (chain alkyl) ether compound is formed of a cycloalkyl group and a chain alkyl group which are bound via an ether group. No particular limitation is imposed on the number of the carbon atoms forming the compound, and the carbon number is generally 4 to 40, preferably 5 to 20.

The cycloalkyl (branched alkyl) ether compound is formed of a cycloalkyl group and a branched alkyl group which are bound via an ether group. No particular limitation is imposed on the number of the carbon atoms forming the compound, and the carbon number is generally 6 to 40, preferably 5 to 20.

The di(cycloalkyl) ether compound is formed of two cycloalkyl groups which are bound via an ether group. No particular limitation is imposed on the number of the carbon atoms forming the compound, and the carbon number is generally 6 to 40, preferably 10 to 20.

Of these, the cyclic ether compound other than the aforementioned epoxy compounds is preferably a cycloalkyl (chain alkyl) ether compound and a cycloalkyl (branched alkyl) ether compound, with a cycloalkyl (chain alkyl) ether compound being more preferred.

The chain alkyl group is a group which is derived by deleting an end hydrogen atom of a corresponding linear-chain aliphatic hydrocarbon. No particular limitation is imposed on the chain alkyl group, and the carbon number is generally 1 to 40, preferably 1 to 20.

Specific examples include, which are not limited to, methyl, ethyl, 1-n-propyl, 1-n-butyl, 1-n-pentyl, 1-n-hexyl, 1-n-heptyl, 1-n-octyl, 1-n-nonyl, and 1-n-decyl.

The branched alkyl group is a group which is derived by deleting a hydrogen atom of a corresponding linear-chain or branched aliphatic hydrocarbon and which is a group other than chain alkyl groups. No particular limitation is imposed on the number of carbon atoms of the chain alky group, and the carbon number is generally 3 to 40, preferably 3 to 20.

Specific examples include, which are not limited to, isopropyl, isobutyl, s-butyl, and t-butyl.

The cycloalkyl group a group which is derived by deleting a hydrogen atom bound to a ring-forming carbon atom of the corresponding cyclic aliphatic hydrocarbon. No particular limitation is imposed on the number of carbon atoms, and the carbon number is generally 3 to 40, preferably 5 to 20.

Specific examples include, which are not limited to, monocycloalkyl groups such as cyclopropyl, cyclobutyl, cyclopentyl, cycloheptyl, and cyclohexyl; and bicycloalkyl groups such as bicyclo[2.2.1]heptan-1-yl, bicyclo[2.2.1]heptan-2-yl, bicyclo[2.2.1]heptan-7-yl, bicyclo[2.2.2]octan-1-yl, bicyclo[2.2.2]octan-2-yl, and bicyclo[2.2.2]octan-7-yl.

Specific examples of the cycloalkyl (chain alkyl) ether compound include, but are not limited to, cyclopentyl methyl ether (CPME), cyclopentyl ethyl ether, cyclopentyl propyl ether, cyclopentyl butyl ether, cyclohexyl methyl ether, cyclohexyl ethyl ether, cyclohexyl propyl ether, and cyclohexyl butyl ether.

Specific examples of the cycloalkyl (branched alkyl) ether compound include, but are not limited to, cyclopentyl isopropyl ether and cyclopentyl t-butyl ether.

Specific examples of the di(cycloalkyl)ether compound include, but are not limited to, dicyclopentyl ether, dicyclohexyl ether, and cyclopentyl cyclohexyl ether.

In the solvent of the cleaning agent composition of the present invention, generally, the amide derivative is present in an amount of 30 to 90 mass %, and the balance is the aforementioned non-amide organic solvent(s).

The cleaning agent composition of the present invention has a water content less than 4.0 mass %. When the water content is 4 mass % or more, the cleaning performance of the composition considerably decreases. Although no precise reason therefor has been elucidated, conceivably, the quaternary ammonium salt present in the cleaning agent composition is adversely affected, to thereby impair the function of the cleaning agent composition. Notably, in the present invention, water content can be determined by means of, for example, a Karl Fischer moisture meter CA-200 (product of Mitsubishi Chemical Analytech).

From the viewpoint of providing a cleaning agent composition having excellent cleaning performance at high reproducibility, the water content of the cleaning agent composition of the present invention is preferably less than 3.0 mass %, more preferably less than 2.0 mass %, still more preferably less than 1.5 mass %, further preferably less than 1.0 mass %, yet more preferably less than 0.8 mass %.

Further, in a preferred embodiment of the present invention, the solvent of the cleaning agent composition is formed only of organic solvents. By use of a totally organic solvent, a cleaning agent composition having excellent cleaning performance can be provided at high reproducibility.

Thus, the cleaning agent composition of the present invention generally contains only organic solvents as the solvent components. Notably, the expression "only organic solvent(s)" refers to the intended component of the solvent being formed of only an organic solvent, and does not exclude the presence of water unavoidably contained in the organic solvent and in other components (e.g., a hydrate).

In other words, a technical feature of the cleaning agent composition of the present invention resides in that the composition contains substantially no water. As described above, the concept "containing substantially no water" refers to "containing no intentionally added water" and does not exclude the presence of water attributable to a hydrate (other components) or the presence of a microamount of water unavoidably incorporated into the composition with other components.

However, when the cleaning agent composition of the present invention employs only organic solvents as solvent components, the aforementioned water content of the cleaning agent composition of the invention must fall within the above-specified ranges.

The cleaning agent composition of the present invention may be prepared by mixing the aforementioned quaternary ammonium salt or a hydrate thereof, the aforementioned first and second organic solvents, and other optional components. No particular limitation is imposed on the hydrate, and examples thereof include tetrabutylammonium fluoride trihydrate.

These ingredients may be mixed in any chronological order, so long as problematic phenomena (e.g., precipitation of solid contents and separation of the composition) do not eventually occur.

That is, a part of the ingredients of the cleaning agent composition may be mixed in advance, followed by mixing of the other ingredients. Alternatively, all the ingredients may be mixed through a single mixing operation. If required, the cleaning agent composition may be filtered. Alternatively, the supernatant of the mixed product is separated from insoluble components and may be employed as the cleaning agent composition. Further, in the case where a certain ingredient employed has hygroscopicity, deliquescency, or the like, the entire or a part of the steps of preparing the cleaning agent composition may be conducted under inert gas.

The above-described cleaning agent composition of the present invention exerts excellent cleansability to a polysiloxane adhesive and attains a high cleaning speed and an excellent cleaning persistency.

Specifically, the cleaning speed is determined as an etching rate [μm/min], which is determined by measuring a decrease in the layer (film) thickness of an adhesive layer obtained from an adhesive composition of interest after contact with the cleaning agent composition for 5 minutes at room temperature (23° C.) and dividing the value of decrease in the layer thickness by the time required for cleaning. The etching rate is generally 8.0 [μm/min] or greater, 9.0 [μm/min] or greater in a preferred embodiment, 9.5 [μm/min] or greater in a more preferred embodiment, 10.0 [μm/min] or greater in a still more preferred embodiment, 10.5 [μm/min] or greater in a yet more preferred embodiment, and 11.0 [μm/min] or greater in a further more preferred embodiment The cleaning persistency of the cleaning agent composition of the present invention is assessed by the time for dissolving 1 g of an adhesive solid obtained from an adhesive composition through contact with the cleaning agent composition (2 g) at room temperature (23° C.). The cleaning persistency is generally 12 to 24 hours for substantial dissolution of the adhesive solid, 2 to 12 hours for complete dissolution of the adhesive solid in a preferred embodiment, and 1 to 2 hours for complete dissolution of the adhesive solid in a more preferred embodiment.

According to the present invention, a polysiloxane adhesive remaining on a substrate (e.g., a semiconductor substrate) is removed by use of the above-described cleaning agent composition, whereby the substrate can be cleaned within a short period of time. Thus, high-efficiency (favorable) cleaning of a substrate (e.g., a semiconductor substrate) can be achieved.

The cleaning agent composition of the present invention is used for surface-cleaning of various substrates including semiconductor substrates. The cleaning target is not limited to a silicon semiconductor substrate, and various substrates may be cleaned. Examples of such substrates (cleaning targets) include a germanium substrate, a gallium arsenide substrate, a gallium phosphide substrate, a gallium aluminum arsenide substrate, an aluminum-plated silicon substrate, a copper-plated silicon substrate, a silver-plated silicon substrate, a gold-plated silicon substrate, a titanium-plated silicon substrate, a silicon nitride film-coated silicon substrate, a silicon oxide film-coated silicon substrate, a polyimide film-coated silicon substrate, a glass substrate, a quartz substrate, a liquid crystal substrate, and an organic EL substrate.

One suitable mode of use of the cleaning agent composition of the present invention in semiconductor processing is use thereof in a method for producing a processed substrate (e.g., a thinned substrate) employed in semiconductor packaging techniques such as TSV.

More specifically, the cleaning agent composition of the present invention is used as a cleaning agent composition in a processed substrate production method including a first step of producing a laminate including a semiconductor substrate, a support substrate, and an adhesive layer formed from an adhesive composition; a second step of processing the semiconductor substrate of the produced laminate; a third step of separating the semiconductor substrate after processing; and a fourth step of removing an adhesive residue remaining on the separated semiconductor substrate with the cleaning agent composition.

Typically, the adhesive composition used in the first step for forming an adhesive layer may be at least one species selected from the group consisting of a silicone adhesive (i.e., a polysiloxane adhesive), an acrylic resin adhesive, an epoxy resin adhesive, a polyamide adhesive, a polystyrene adhesive, a polyimide adhesive, and a phenolic resin adhesive. Particularly for removing a polysiloxane adhesive, the cleaning agent composition of the present invention is effectively used. Among polysiloxane adhesives, the cleaning agent composition of the present invention is effective for removing an adhesive residue originating from a polysiloxane adhesive containing a component (A) which is cured through hydrosilylation.

Thus, next will be described a method for producing a processed substrate by use of a polysiloxane adhesive (adhesive composition) containing a component (A) which is cured through hydrosilylation, and the cleaning agent composition of the present invention. However, needless to say, the present invention is not limited to this production method.

Firstly, there will be described the first step of producing a laminate including a semiconductor substrate, a support substrate, and an adhesive layer formed from an adhesive composition.

The component (A) which is contained in the adhesive composition and which is cured through hydrosilylation contains, for example, a polysiloxane (A1) having one or more units selected from the group consisting of a siloxane unit represented by $SiO_2$ (unit Q), a siloxane unit represented by $R^1R^2R^3SiO_{2/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^1R^2R^3SiO_{1/2}$ (unit M'), a siloxane unit represented by $R^4R^5SiO_{2/2}$ (unit D'), and a siloxane unit represented by $R^6SiO_{3/2}$ (unit T'), and at least one unit selected from the group consisting of unit M', unit D', and unit I', and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit I''), and at least one unit selected from the group consisting of unit M'', unit D'', and unit T''.

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic. However, a linear-chain alkyl group and a branched-chain alkyl group are preferred. No particular limitation is imposed on the number of carbon atoms thereof, and the number of carbon atoms is generally 1 to 40, preferably 30 or less, more preferably 20 or less, still more preferably 10 or less.

Specific examples of the linear-chain or branched-chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cycloalkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain or branched-chain. No particular limitation is imposed on the number of carbon atoms thereof, and the number of carbon atoms is generally 2 to 40, preferably 30 or less, more preferably 20 or less, still more preferably 10 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2).

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T". Two or more polyorganosiloxanes satisfying the above conditions may be used in combination as the polyorganosiloxane (a2).

Examples of preferred combinations of two or more units selected from the group consisting of unit Q", unit M", unit D", and unit T" include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) are generally 500 to 1,000,000, preferably 5,000 to 50,000.

Meanwhile, weight average molecular weight may be determined by means of, for example, a GPC apparatus (EcoSEC, HLC-8320GPC, products of Tosoh Corporation) and GPC columns (Shodex(registered trademark), KF-803L, KF-802, and KF-801, products of Showa Denko K.K.) at a column temperature of 40° C. and a flow rate of 1.0 mL/min by use of tetrahydrofuran as an eluent (extraction solvent) and polystyrene (product of Sigma-Aldrich) as a standard substance.

The polyorganosiloxane (a1) and the polyorganosiloxane (a2) contained in the adhesive composition react with each other via hydrosilylation, to thereby form a cured film. Thus, the curing mechanism differs from the mechanism of curing mediated by, for example, silanol groups. Therefore, neither of the siloxanes of the present invention is required to have a silanol group or a functional group forming a silanol group through hydrolysis (e.g., an alkyloxy group).

The component (A) contains the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

The component (A) may contain a polymerization inhibitor (A3). Through incorporation of the polymerization inhibitor into an adhesive composition, heat curing during bonding can be suitably controlled, whereby an adhesive composition which can provide an adhesive layer having an excellent bonding/debonding property can be produced at high reproducibility.

No particular limitation is imposed on the polymerization inhibitor, so long as it can suppress the progress of hydrosilylation. Specific examples of the polymerization inhibitor include, but are not limited to, alkynylalkyl alcohols such as 1-ethynyl-1-cyclohexanol and 1,1-diphenyl-2-propyn-1-ol.

Generally, the amount of polymerization inhibitor with respect to the polyorganosiloxane (a1) and the polyorganosiloxane (a2) is 1,000.0 ppm or more from the viewpoint of attaining the effect, and 10,000.0 ppm or less from the viewpoint of preventing excessive suppression of hydrosilylation.

The adhesive composition may contain a component (B) containing at least one species selected from the group consisting of a component containing an epoxy-group-containing polyorganosiloxane, a component containing a methyl-group-containing polyorganosiloxane, and a component containing a phenyl-group-containing polyorganosiloxane. Through incorporation of such a component (B) into the adhesive composition, the formed adhesive layer can be suitably peeled off at high reproducibility.

The epoxy-group-containing polyorganosiloxane includes, for example, such a siloxane containing a siloxane unit represented by, for example, $R^{11}R^{12}SiO_{2/2}$ (unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

Also, the epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific examples of the organic group containing an epoxy group include, but are not limited to, 3-glycidoxypropyl and 2-(3,4-epoxycyclohexyl)ethyl.

In the present invention, examples of preferred epoxy-group-containing polyorganosiloxanes include, but are not limited to, epoxy-group-containing polydimethylsiloxane.

The epoxy-group-containing polyorganosiloxane contains the aforementioned siloxane unit (unit $D^{10}$), but may also contain the aforementioned unit Q, unit M and/or unit T, in addition to unit $D^{10}$.

In one preferred embodiment, specific examples of the epoxy-group-containing polyorganosiloxane include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-group-containing polyorganosiloxane is preferably an epoxy-group-containing polydimethylsiloxane having an epoxy value of 0.1 to 5. The weight average molecular weight thereof is generally 1,500 to 500,000, but preferably 100,000 or lower, for the purpose of suppression of precipitation in the adhesive composition.

Specific examples of the epoxy-group-containing polyorganosiloxane include, but are not limited to, CMS-227

(product of Gelest Inc., weight average molecular weight: 27,000) represented by formula (A-1), ECMS-327 (product of Gelest Inc., weight average molecular weight: 28,800) represented by formula (A-2), KF-101 (product of Shin-Etsu Chemical Co., Ltd., weight average molecular weight: 31,800) represented by formula (A-3), KF-1001 (product of Shin-Etsu Chemical Co., Ltd., weight average molecular weight: 55,600) represented by formula (A-4), KF-1005 (product of Shin-Etsu Chemical Co., Ltd., weight average molecular weight: 11,500) represented by formula (A-5), X-22-343 (product of Shin-Etsu Chemical Co., Ltd., weight average molecular weight: 2,400) represented by formula (A-6), BY16-839 (product of Dow Corning, weight average molecular weight: 51,700) represented by formula (A-7), and ECMS-327 (product of Gelest Inc., weight average molecular weight: 28,800) represented by formula (A-8).

[F5]

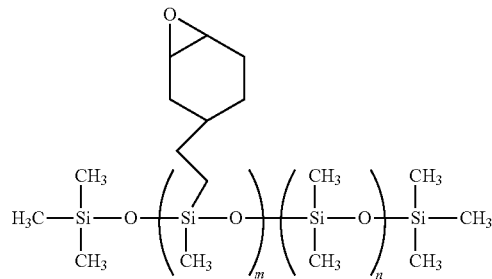

(A-1)

(Each of m and n represents the number of repeating units.)

[F6]

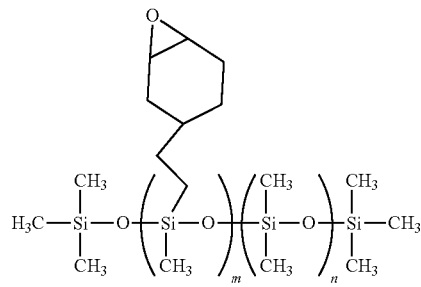

(A-2)

(Each of m and n represents the number of repeating units.)

[F7]

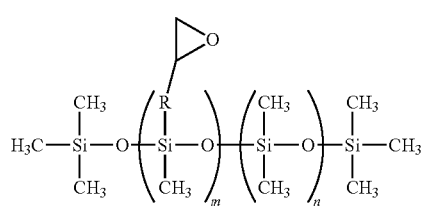

(A-3)

(Each of m and n represents the number of repeating units. R represents a C1 to C10 alkylene group.)

[F8]

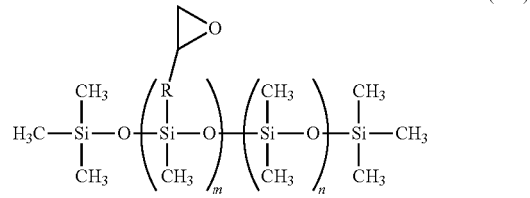

(A-4)

(Each of m and n represents the number of repeating units. R represents a C1 to 010 alkylene group.)

[F9]

(A-5)

(Each of m, n and o represents the number of repeating units. R represents a C1 to C10 alkylene group.)

[F10]

(A-6)

(Each of m and n represents the number of repeating units. R represents a C1 to C10 alkylene group.)

[F11]

(A-7)

(Each of m and n represents the number of repeating units. R represents a C1 to 010 alkylene group.)

[F12]

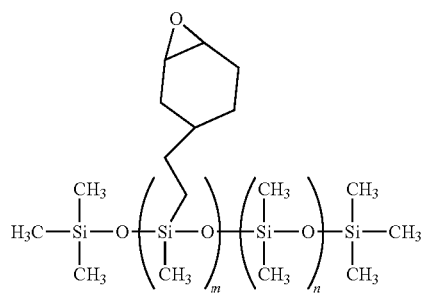

(A-8)

(Each of m and n represents the number of repeating units.)

The methyl-group-containing polyorganosiloxane includes, for example, a siloxane containing a siloxane unit represented by $R^{210}R^{220}SiO_{2/2}$ (unit $D^{200}$), preferably a siloxane containing a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. Rn is preferably a methyl group.

Examples of preferred methyl-group-containing polyorganosiloxanes include, but are not limited to, polydimethylsiloxane.

The methyl-group-containing polyorganosiloxane contains the aforementioned siloxane unit (unit $D^{200}$ or unit $D^{20}$), but may also contain the aforementioned unit Q, unit M and/or unit T, in addition to unit $D^{200}$ or unit $D^{20}$.

In one embodiment, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

The viscosity of the methyl-group-containing polyorganosiloxane is generally 1,000 to 2,000,000 mm$^2$/s, preferably 10,000 to 1,000,000 mm$^2$/s. The methyl-group-containing polyorganosiloxane is typically dimethylsilicone oil formed of polydimethylsiloxane. The value of the viscosity is a kinematic viscosity (cSt (=mm$^2$/s)). The kinematic viscosity may be measured by means of a kinematic viscometer. Alternatively, the kinematic viscosity may also be calculated by dividing viscosity (mPa·s) by density (g/cm$^3$). In other words, the kinematic viscosity may be determined from a viscosity as measured at 25° C. by means of an E-type rotational viscometer and a density. The calculation formula is kinematic viscosity (mm$^2$/s)=viscosity (mPa·s)/density (g/cm$^3$).

Specific examples of the methyl-group-containing polyorganosiloxane include, but are not limited to, WACKER (registered trademark) SILICONE FLUID AK series (products of WACKER) and dimethylsilicone oils (KF-96L, KF-96A, KF-96, KF-96H, KF-69, KF-965, and KF-968) and cyclic dimethylsilicone oil (KF-995) (products of Shin-Etsu Chemical Co., Ltd.).

Examples of the phenyl-group-containing polyorganosiloxane include a siloxane containing a siloxane unit represented by $R^{31}R^{32}SiO_{2/2}$ (unit $D^{30}$).

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In one preferred embodiment, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

The weight average molecular weight of the phenyl-group-containing polyorganosiloxane is generally 1,500 to 500,000, but preferably 100,000 or lower, for the purpose of suppression of precipitation in the adhesive composition and for other reasons.

Specific examples of the phenyl-group-containing polyorganosiloxane include, but are not limited to, PMM-1043 (product of Gelest Inc., weight average molecular weight: 67,000, viscosity: 30,000 mm$^2$/s) represented by formula (C-1), PMM-1025 (product of Gelest Inc., weight average molecular weight: 25,200, viscosity: 500 mm$^2$/s) represented by formula (C-2), KF50-3000CS (product of Shin-Etsu Chemical Co., Ltd., weight average molecular weight: 39,400, viscosity: 3,000 mm$^2$/s) represented by formula (C-3), TSF431 (product of MOMENTIVE, weight average molecular weight: 1,800, viscosity: 100 mm$^2$/s) represented by formula (C-4), TSF433 (product of MOMENTIVE, weight average molecular weight: 3,000, viscosity: 450 mm$^2$/s) represented by formula (C-5), PDM-0421 (product of Gelest Inc., weight average molecular weight: 6,200, viscosity: 100 mm$^2$/s) represented by formula (C-6), and PDM-0821 (product of Gelest Inc., weight average molecular weight: 8,600, viscosity: 125 mm$^2$/s) represented by formula (C-7).

[F13]

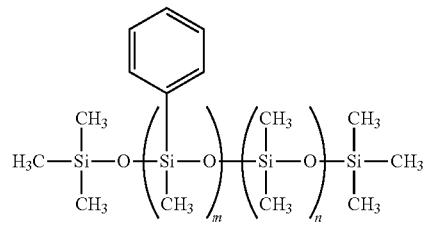

(C-1)

(Each of m and n represents the number of repeating units.)

[F14]

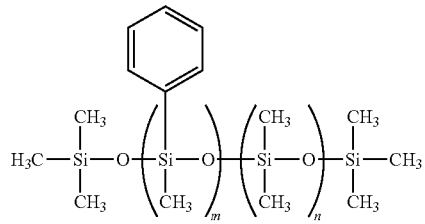
(C-2)

(Each of m and n represents the number of repeating units.)

[F15]

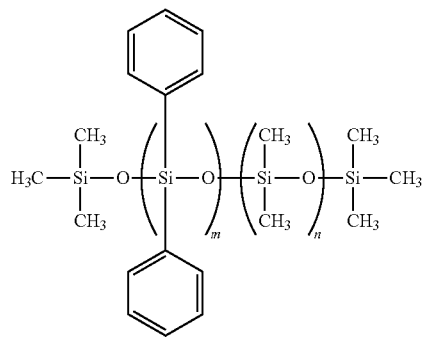
(C-3)

(Each of m and n represents the number of repeating units.)

[F16]

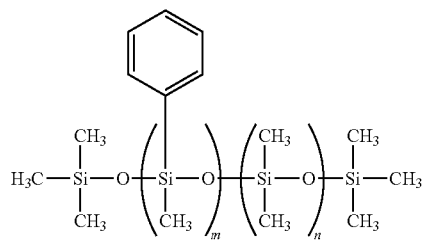
(C-4)

(Each of m and n represents the number of repeating units.)

[F17]

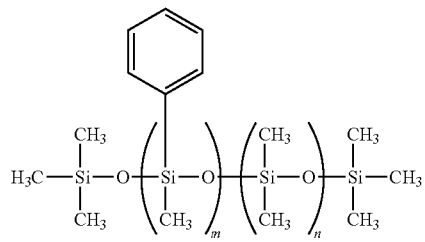
(C-5)

(Each of m and n represents the number of repeating units.)

[F18]

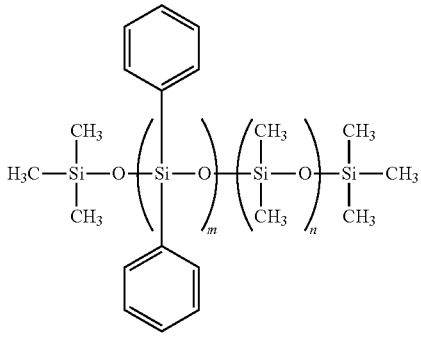
(C-6)

(Each of m and n represents the number of repeating units.)

[F19]

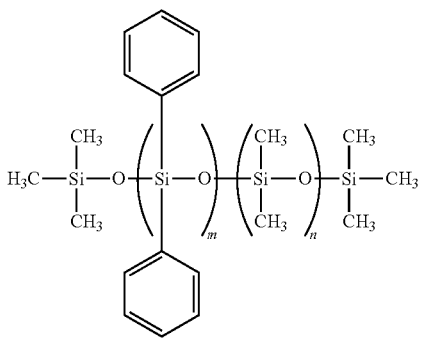
(C-7)

(Each of m and n represents the number of repeating units.)

The polysiloxane adhesive composition contains the components (A) and (B) at any compositional ratio. In consideration of the balance between bonding performance and debonding performance, the compositional ratio (mass %) of component (A) to component (B) is preferably 99.995:0.005 to 30:70, more preferably 99.9:0.1 to 75:25.

For the purpose of adjusting the viscosity or for other reasons, the adhesive composition may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition contains a solvent, the solvent content is appropriately adjusted in consideration of a target viscosity of the adhesive composition, the application method to be employed, the thickness of the formed thin film, etc. The solvent content of the entire composition is about 10 to about 90 mass %.

The adhesive composition generally has a viscosity (25° C.) of 1,000 to 20,000 mPa·s. The viscosity may be controlled by modifying the type and formulation of the solvent used, the film-forming component concentration, etc., in consideration of various factors such as the coating method employed and the target film thickness.

The adhesive composition used in the present invention may be produced by mixing film-forming components with solvent. However, in the case where no solvent is used, the adhesive composition used in the present invention may be produced by mixing film-forming components.

No particular limitation is imposed on the sequential order of mixing, so long as the adhesive composition of the present invention can be easily produced at high reproducibility. One possible example of the production method includes dissolving all film-forming components in a solvent. Another possible example of the production method includes dissolving a part of film-forming components in a solvent, dissolving the other film-forming components in another solvent, and mixing the two thus-obtained solutions. In this case, if required, a part of the solvent or a film-forming component having high dissolvability may be added in a final stage.

So long as the relevant components are not decomposed or denatured in preparation of the adhesive composition, the mixture may be appropriately heated. Also, in order to remove foreign substances present in the adhesive composition, the composition may be filtered through a sub-micrometer filter or the like in the course of production of the composition or after mixing all the components.

The first step of the processed substrate production method specifically includes a primary step and a subsequent step. In the primary step, the adhesive composition is applied onto a surface of the semiconductor substrate or the support substrate, to thereby form an adhesive coating layer. In the subsequent step, the semiconductor substrate is adhered to the support substrate by the mediation of the adhesive coating layer, and a load is applied to the semiconductor substrate and the support substrate in a thickness direction, to thereby closely adhere the semiconductor substrate, the adhesive coating layer, and the support substrate, while at least one of a heat treatment and a reduced pressure treatment is performed. Then, a post-heat treatment is performed. Through the post-heat treatment in the subsequent step, the adhesive coating layer is suitably cured in a final stage to form an adhesive layer. Thus, a laminate is provided.

In one embodiment, the semiconductor substrate is a wafer, and the support substrate is a support. The adhesive composition may be applied to either of the semiconductor or support substrate, or both of the semiconductor and support substrates.

No particular limitation is imposed on the wafer. Examples of the wafer include, but are not limited to, a silicon wafer or a glass wafer having a diameter of about 300 mm and a thickness of about 770 μm.

No particular limitation is imposed on the support (carrier). Examples of the support include, but are not limited to, a silicon wafer having a diameter of about 300 mm and a thickness of about 700 μm.

The thickness of the aforementioned adhesive coating layer is generally 5 to 500 μm. However, the thickness is preferably 10 μm or greater, more preferably 20 μm or greater, still more preferably 30 μm or greater, from the viewpoint of maintaining the film strength, and it is preferably 200 μm or less, more preferably 150 μm or less, still more preferably 120 μm or less, yet more preferably 70 μm or less, from the viewpoint of avoiding variation in uniformity of the film thickness.

No particular limitation is imposed on the application method, and spin coating is generally employed. In an alternative method, a coating film is formed through spin coating or a similar technique, and the sheet-form coating film is attached. The concepts of the application method and the coating film of the invention also encompass the alternative method and coating film.

The heating temperature is generally 80° C. or higher, preferably 150° C. or lower, from the viewpoint of prevention of excessive curing. The time of heating is generally 30 seconds or longer, preferably 1 minute or longer, for securing temporary bonding performance. Also, the heating time is generally 10 minutes or shorter, preferably 5 minutes or shorter, from the viewpoint of suppressing deterioration of the adhesive layer and other members.

In the reduced pressure treatment, the two substrates and the adhesive coating layer disposed therebetween are placed in an atmosphere at 10 Pa to 10,000 Pa. The time of the reduced pressure treatment is generally 1 to 30 minutes.

In one preferred embodiment of the present invention, the two substrates and the adhesive coating layer disposed therebetween are bonded together preferably through a heat treatment, more preferably through a heat treatment in combination with a reduced pressure treatment.

No particular limitation is imposed on the load which is applied to the semiconductor substrate and the support substrate in a thickness direction, so long as the semiconductor substrate, the support substrate, and the layer disposed therebetween are not damaged, and these elements are closely adhered. The load is generally 10 to 1,000 N.

The temperature of post-heating is preferably 120° C. or higher from the viewpoint of attaining sufficient curing rate, and preferably 260° C. or lower from the viewpoint of preventing deterioration of the substrates and the adhesives. The heating time is generally 1 minute or longer from the viewpoint of joining of a wafer through curing, preferably 5 minutes or longer from the viewpoint of, for example, stability in physical properties of the adhesives. Also, the heating time is generally 180 minutes or shorter, preferably 120 minutes or shorter, from the viewpoint of avoiding, for example, an adverse effect on the adhesive layers due to excessive heating. Heating may be performed by means of a hot plate, an oven, or the like. Notably, a purpose of performing post-heating is to, for example, more suitably cure the component (A).

There will next be described the second step for processing the semiconductor substrate of the laminate produced through the aforementioned method.

One example of the processing applied to the laminate used in the present invention is processing of a surface opposite the circuit-furnished surface of the semiconductor substrate. Typically, the processing is thinning a wafer by polishing (grinding) the backside thereof. Thereafter, the thinned wafer is provided with silicon vias (TSVs) and the like and then removed from the support. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is applied to the laminate bonded to the support. The adhesive layer included in the laminate used in the present invention has heat resistance to the load.

In one specific embodiment, when the backside surface (a surface opposite the circuit-furnished surface) of a wafer having a diameter of about 300 mm and a thickness of about 770 μm is polished (ground), the thickness of the wafer can be reduced to about 80 μm to about 4 μm.

Next will be described the third step of debonding the semiconductor substrate after processing.

Examples of the laminate debonding method employed in the present invention include, but are not limited to, debonding with solvent, debonding with laser light, mechanical debonding by means of a machine member having a sharp part, and peeling between a support and a wafer. Generally, debonding is performed after processing (e.g., thinning).

In the third step, the adhesive is not always removed while the adhesive is firmly attached to the support substrate, and in some cases, a part of the adhesive may remain on the processed substrate. Thus, in the fourth step, the surface of the substrate on which the adhesive residue is deposited is cleaned by use of the aforementioned cleaning agent composition of the present invention. As a result, the adhesive remaining on the substrate can be satisfactorily removed.

Finally, the fourth step will be described. In the fourth step, the adhesive residue remaining on the debonded semiconductor substrate is removed by use of the cleaning agent composition.

The fourth step corresponds to removing the adhesive residue remaining on the surface of the debonded substrate by use of the cleaning agent composition of the present invention. In one specific procedure, a thinned substrate on which an adhesive remains is immersed in the cleaning agent composition of the present invention and, if required, subjected to ultrasonic cleaning or the like, to thereby remove the adhesive residue.

When ultrasonic cleaning is employed, the cleaning conditions are appropriately determined in consideration of the surface state of the substrate. Generally, through ultrasonic cleaning at 20 kHz to 5 MHz for 10 seconds to 30 minutes, the adhesive residue remaining on the substrate can be satisfactorily removed.

The method of the present invention for producing a processed substrate (e.g., a thinned substrate) includes the aforementioned first to fourth steps, but may further include another step. For example, in the fourth step, before cleaning with the cleaning agent composition of the present invention, if required, the substrate may be immersed in various solvents, or subjected to tape peeling, to thereby remove the adhesive residue.

Notably, the aforementioned elements in terms of configuration and method employed in the first to fourth steps may be modified in various ways, so long as the modifications do not deviate from the scope of the present invention.

EXAMPLES

The present invention will next be described in detail by way of Examples and Comparative Examples, which should not be construed as limiting the invention thereto. The apparatuses employed in the present invention are as follows.
(1) Agitator: Planetary centrifugal mixer ARE-500 (product of Thinky Corporation)
(2) Viscometer: Rotary viscometer TVE-22H (product of Toki Sangyo Co., Ltd)
(3) Agitator: Mix Roter Variable 1-1186-12 (product of As One Corporation)
(4) Agitator H: Heating Rocking Mixer HRM-1 (product of As One Corporation)
(5) Contact-type film thickness meter: Wafer thickness meter WT-425 (product of Tokyo Seimitsu Co., Ltd.)
[1] Preparation of Adhesive Compositions Preparation Example 1

To a 600-mL agitation container dedicated for a planetary centrifugal mixer, there were added a base polymer formed of linear-chain polydimethylsiloxane having vinyl groups (viscosity: 200 mPa·s) and an MQ resin having vinyl groups (product of WACKER Chemie AG) (a1) (150 g), linear-chain polydimethylsiloxane having Si—H groups (viscosity: 100 mPa·s) (product of WACKER Chemie AG) (a2) (15.81 g), and 1-ethynyl-1-cyclohexanol (product of WACKER Chemie AG) (A3) (0.17 g), and the resultant mixture was agitated by means of a planetary centrifugal mixer for 5 minutes.

Separately, a platinum catalyst (product of WACKER Chemie AG) (A2) (0.33 g) and linear-chain polydimethylsiloxane having vinyl groups (viscosity: 1,000 mPa·s) (product of WACKER Chemie AG) (a1) (9.98 g) were added to a 50-mL screw tube, and the contents were agitated for 5 minutes by means of a planetary centrifugal mixer. A portion (0.52 g) of the thus-agitated mixture was added to the above mixture, and the resultant mixture was agitated for 5 minutes by means of a planetary centrifugal mixer. Finally, the product mixture was filtered through a nylon filter (300 mesh), to thereby prepare an adhesive composition having a viscosity of 9,900 mPa·s as determined by means of a rotary viscometer.

Preparation Example 2

To a 600-mL agitation container dedicated for a planetary centrifugal mixer, a base polymer formed of an MQ resin having vinyl groups (product of WACKER Chemie AG) (a1) (95 g), p-menthane (product of Nippon Terpene Chemicals, Inc.) (93.4 g) serving as a solvent, and 1,1-diphenyl-2-propyn-1-ol (product of Tokyo Chemical Industry Co., Ltd.) (A3) (0.41 g) were added, and the resultant mixture was agitated for 5 minutes by means of a planetary centrifugal mixer.

To the thus-prepared mixture, there were added linear-chain polydimethylsiloxane having Si—H groups (viscosity: 100 mPa·s) (product of WACKER Chemie AG) (a2), linear-chain polydimethylsiloxane having vinyl groups (viscosity: 200 mPa·s) (product of WACKER Chemie AG) (a1) (29.5 g), polyorganosiloxane (polydimethylsiloxane, viscosity: 1,000,000 mm$^2$/s) (AK1000000, product of WACKER Chemie AG) (B), and 1-ethynyl-1-cyclohexanol (product of WACKER Chemie AG) (A3) (0.41 g), and the resultant mixture was further agitated for 5 minutes by means of a planetary centrifugal mixer.

Separately, a platinum catalyst (product of WACKER Chemie AG) (A2) (0.20 g) and linear-chain polydimethylsiloxane having vinyl groups (viscosity: 1,000 mPa·s) (product of WACKER Chemie AG) (a1) (17.7 g) were added to a 50-mL screw tube, and the contents were agitated for 5 minutes by means of a planetary centrifugal mixer. A portion (14.9 g) of the thus-agitated mixture was added to the above mixture, and the resultant mixture was further agitated for 5 minutes by means of the planetary centrifugal mixer. Finally, the product mixture was filtered through a nylon filter (300 mesh), to thereby prepare an adhesive composition having a viscosity of 4,600 mPa·s as determined by means of a rotary viscometer.

[2] Preparation of Cleaning Agent Compositions

Example 1

N,N-Dimethylpropionamide (14.25 g) and 1,2-diethoxyethane (14.25 g) were added to tetrabutylammonium fluoride trihydrate (product of Kanto Chemical Co., Inc.) (1.50 g), and the thus-obtained mixture was agitated, to thereby prepare a cleaning agent composition.

Example 2

N,N-Dimethylpropionamide (11.18 g) and tetrahydrofuran (11.18 g) were added to tetrabutylammonium fluoride trihydrate (product of Kanto Chemical Co., Inc.) (1.18 g), and the thus-obtained mixture was agitated, to thereby prepare a cleaning agent composition.

Example 3

N,N-Dimethylpropionamide (20.08 g) and tetrahydropyran (20.08 g) were added to tetrabutylammonium fluoride trihydrate (product of Kanto Chemical Co., Inc.) (2.11 g), and the thus-obtained mixture was agitated, to thereby prepare a cleaning agent composition.

Example 4

N,N-Dimethylpropionamide (17.81 g) and cyclopentyl methyl ether (17.81 g) were added to tetrabutylammonium fluoride trihydrate (product of Kanto Chemical Co., Inc.) (1.88 g), and the thus-obtained mixture was agitated, to thereby prepare a cleaning agent composition.

Example 5

N,N-Dimethylpropionamide (10.25 g) and mesitylene (10.25 g) were added to tetrabutylammonium fluoride trihydrate (product of Kanto Chemical Co., Inc.) (1.08 g), and the thus-obtained mixture was agitated, to thereby prepare a cleaning agent composition.

Example 6

N,N-Dimethylisobutylamide (12.52 g) and 1,2-diethoxyethane (12.52 g) were added to tetrabutylammonium fluoride trihydrate (product of Kanto Chemical Co., Inc.) (1.32 g), and the thus-obtained mixture was agitated, to thereby prepare a cleaning agent composition.

Example 7

N,N-Dimethylisobutylamide (12.52 g) and tetrahydrofuran (12.52 g) were added to tetrabutylammonium fluoride trihydrate (product of Kanto Chemical Co., Inc.) (1.32 g), and the thus-obtained mixture was agitated, to thereby prepare a cleaning agent composition.

Example 8

N,N-Dimethylisobutylamide (12.52 g) and tetrahydropyran (12.52 g) were added to tetrabutylammonium fluoride trihydrate (product of Kanto Chemical Co., Inc.) (1.32 g), and the thus-obtained mixture was agitated, to thereby prepare a cleaning agent composition.

Example 9

N,N-Dimethylisobutylamide (12.52 g) and cyclopentyl methyl ether (12.52 g) were added to tetrabutylammonium fluoride trihydrate (product of Kanto Chemical Co., Inc.) (1.32 g), and the thus-obtained mixture was agitated, to thereby prepare a cleaning agent composition.

Example 10

N,N-Dimethylisobutylamide (12.52 g) and mesitylene (12.52 g) were added to tetrabutylammonium fluoride trihydrate (product of Kanto Chemical Co., Inc.) (1.32 g), and the thus-obtained mixture was agitated, to thereby prepare a cleaning agent composition.

Comparative Example 1

N,N-Dimethylacetamide (9.50 g) was added to tetrabutylammonium fluoride trihydrate (product of Kanto Chemical Co., Inc.) (0.50 g), and the thus-obtained mixture was agitated, to thereby prepare a cleaning agent composition.

Comparative Example 2

1,3-Dimethyl-2-imidazolidinone (95 g) was added to tetrabutylammonium fluoride trihydrate (product of Kanto Chemical Co., Inc.) (5 g), and the thus-obtained mixture was agitated, to thereby prepare a cleaning agent composition.

Comparative Example 3

N-Methyl-2-pyrrolidone (dehydrated) (95 g) was added to tetrabutylammonium fluoride trihydrate (product of Kanto Chemical Co., Inc.) (5 g), and the thus-obtained mixture was agitated, to thereby prepare a cleaning agent composition.

Comparative Example 4

N,N-Dimethylpropionamide (product of Tokyo Chemical Industry Co., Ltd.) (47.5 g) and tetrahydrofuran (product of Kanto Chemical Co., Inc.) (47.5 g) were added to tetrabutylammonium fluoride trihydrate (product of Kanto Chemical Co., Inc.) (5 g), and the thus-obtained mixture was agitated. Subsequently, pure water (5 g) was further added thereto, and the resultant mixture was further agitated, to thereby prepare a cleaning agent composition.

Comparative Example 5

A commercial silicone cleaner "KSR-1" (product of Kanto Chemical Co., Inc.) was used as a cleaning liquid composition.

[3] Evaluation of Performance of Cleaning Agent Compositions

Generally, the excellent cleaning agent composition is required to exhibit such a high cleaning speed that it can dissolve an adhesive residue immediately after contact therewith, and excellent persistency in cleaning speed. Thus, the following tests were performed. When a tested cleaning agent composition exhibits both higher cleaning speed and more excellent persistency in cleaning performance, more effective cleaning can be expected.

[3-1] Determination of Water Content

The water content of each cleaning agent composition was determined by means of a Karl Fischer moisture meter CA-200 (product of Mitsubishi Chemical Analytech).

[3-2] Determination of Etching Rate

Each of the prepared cleaning agent compositions was evaluated in terms of cleaning speed by measuring the etching rate. Specifically, the adhesive composition obtained in Preparation Example 1 was applied onto a 12-inch silicon wafer by means of a spin coater so as to adjust the coating thickness to 100 μm, and cured at 150° C. for 15 minutes, then 190° C. for 10 minutes. The thus-coated wafer was cut into square chips (4 cm×4 cm), and the layer (film) thickness of one of the chips was measured by means of a contact-type film thickness meter. Thereafter, the chip was placed in a 9-cm Petri dish made of stainless steel, and the cleaning agent composition (7 mL) was added, followed by closing the dish. The closed Petri dish was placed on Agitator H, and the chip was cleaned through agitation at 23° C. for 5 minutes. After cleaning, the chip was removed and washed with isopropanol and pure water, and then dry-baked at 150° C. for 1 minute. The layer (film) thickness of the chip was measured again by means of the contact-type film thickness meter. Through dividing the decrease in layer (film) thickness after cleaning by the cleaning time, etching rate [μm/min] was calculated. The etching rate was employed as an index for cleaning performance. Table 1 shows the results.

[3-3] Evaluation of Dissolution Property

For determining the persistency in cleaning performance of each of the prepared cleaning agent compositions, the following adhesive dissolution test was conducted. Specifically, the adhesive composition obtained in Preparation Example 2 was applied onto a 12-inch silicon wafer by means of a spin coater and cured at 120° C. for 1.5 minutes and 200° C. for 10 minutes. Subsequently, the cured adhesive composition was scraped off by use of a cutter blade from the 12-inch wafer. A portion (1 g) of the cured adhesive composition was transferred to and weighed in a 9-mL screw tube, and then the cleaning agent composition (2 g) was added to the tube. The dissolution state of the cured product was observed at 23° C. When the cured product was completely dissolved within 1 to 2 hours, the state was rated as "Excellent." When the cured product was completely dissolved within 2 to 12 hours, the state was rated as "Very good." When the cured product was substantially dissolved within 12 to 24 hours, the state was rated as "Good." When the cured product was substantially not dissolved over a long period of time, the state was rated as "Bad." Table 1 shows the results.

TABLE 1

| | Water content (%) | Etching rate [μm/min] | Dissolution test |
|---|---|---|---|
| Ex. 1 | 0.67 | 10.8 | Excellent |
| Ex. 2 | 0.65 | 14.72 | Excellent |
| Ex. 3 | 0.67 | 10.62 | Excellent |
| Ex. 4 | 0.63 | 11.51 | Excellent |
| Ex. 5 | 0.63 | 8.72 | Excellent |
| Ex. 6 | 0.63 | 10.28 | Excellent |
| Ex. 7 | 0.78 | 13.85 | Excellent |
| Ex. 8 | 0.73 | 9.93 | Excellent |
| Ex. 9 | 0.71 | 10.26 | Excellent |
| Ex. 10 | 0.72 | 8.32 | Very good |
| Comp. Ex. 1 | — | 8 | Bad |
| Comp. Ex. 2 | — | 4 | Bad |
| Comp. Ex. 3 | — | 5.1 | Bad |
| Comp. Ex. 4 | 5.36 | 0.69 | — |
| Comp. Ex. 5 | — | 2.3 | Bad |

As shown in Table 1, the cleaning agent compositions, each containing a quaternary ammonium salt (i.e., tetrabutylammonium fluoride), an amide derivative represented by formula (Z) (i.e., N,N-dimethylpropionamide), and a non-amide solvent, fell within the scope of the present invention and were found to exhibit excellent cleaning speed and favorable persistency in cleaning performance, as compared with those of cleaning agent compositions each containing a solvent formed only of an amide derivative not represented by formula (Z) and a cleaning agent composition containing intentionally added water.

The invention claimed is:

1. A cleaning agent composition for use in removing an adhesive residue,
   the composition comprising a quaternary ammonium salt and a composition solvent including a first organic solvent and a second organic solvent;
   the first organic solvent is an amide derivative represented by formula (Z):

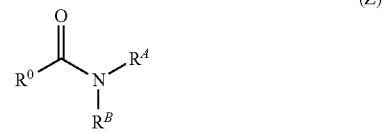

wherein $R^O$ represents an ethyl group, a propyl group, or an isopropyl group; and each of $R^A$ and $R^B$ represents a C1 to C4 alkyl group;
   the second organic solvent is a non-amide organic solvent other than the amide derivative;
   the quaternary ammonium salt includes a fluorine-containing quaternary ammonium salt; and
   the composition has a water content less than 4.0 mass %.

2. The cleaning agent composition according to claim 1, wherein the amide derivative includes at least one species selected from the group consisting of N,N-dimethylpropionamide, N,N-diethylpropionamide, N-ethyl-N-methylpropionamide, N,N-dimethylbutyramide, N,N-diethylbutyramide, N-ethyl-N-methylbutyramide, N,N-dimethylisobutyramide, N,N-diethylisobutyramide, and N-ethyl-N-methylisobutyramide.

3. The cleaning agent composition according to claim 2, wherein the amide derivative includes at least one species selected from the group consisting of N,N-dimethylpropionamide, N,N-diethylpropionamide, N,N-dimethylbutyramide, N,N-diethylbutyramide, N,N-dimethylisobutyramide, and N,N-diethylisobutyramide.

4. The cleaning agent composition according to claim 3, wherein the amide derivative includes at least one species selected from the group consisting of N,N-dimethylpropionamide and N,N-dimethylisobutyramide.

5. The cleaning agent composition according to claim 1, wherein the fluorine-containing quaternary ammonium salt includes a tetra(hydrocarbyl)ammonium fluoride.

6. The cleaning agent composition according to claim 5, wherein the tetra(hydrocarbyl)ammonium fluoride includes at least one species selected from the group consisting of tetramethylammonium fluoride, tetraethylammonium fluoride, tetrapropylammonium fluoride, and tetrabutylammonium fluoride.

7. The cleaning agent composition according to claim 1, wherein the second organic solvent includes at least one species selected from the group consisting of an alkylene glycol dialkyl ether, an aromatic hydrocarbon compound, and a ring-structure-having ether compound.

8. The cleaning agent composition according to claim 1, wherein the composition solvent is formed only of an organic solvent.

9. The cleaning agent composition according to claim 1, wherein the composition solvent has an amide derivative content of 30 to 90 mass %.

10. The cleaning agent composition according to claim 1, which has a water content less than 3.0 mass %.

11. The cleaning agent composition according to claim 10, which has a water content less than 2.0 mass %.

12. The cleaning agent composition according to claim 11, which has a water content less than 1.0 mass %.

13. A cleaning method, comprising removing an adhesive residue remaining on a substrate by use of the cleaning agent composition as recited in claim 1.

14. A method for producing a processed semiconductor substrate, the method comprising:
producing a laminate including a semiconductor substrate, a support substrate, and an adhesive layer formed from an adhesive composition;
processing the semiconductor substrate of the produced laminate;
separating the semiconductor substrate after processing; and
removing an adhesive residue remaining on the separated substrate with a cleaning agent composition,
wherein the cleaning agent composition as recited in claim 1 is used as the cleaning agent composition.

* * * * *